United States Patent [19]

Danby et al.

[11] Patent Number: 4,737,713

[45] Date of Patent: Apr. 12, 1988

[54] APPARATUS AND METHOD FOR PROCESSING AN ELECTRICAL SIGNAL AND INCREASING A SIGNAL-TO-NOISE RATIO THEREOF

[75] Inventors: Gordon T. Danby, Wading River; Jan V. Votruba, Port Jefferson Station; Raymond V. Damadian, Woodbury; Guo Ping Zhang, New York, all of N.Y.

[73] Assignee: Fonar Corporation, Melville, N.Y.

[21] Appl. No.: 935,279

[22] Filed: Nov. 26, 1986

[51] Int. Cl.[4] ............................................. G01R 33/20
[52] U.S. Cl. .................................... 324/307; 324/322; 324/77 E
[58] Field of Search ............... 324/300, 307, 309, 311, 324/312, 318, 322, 77 R, 77 D, 77 E, 77 F

[56] References Cited

U.S. PATENT DOCUMENTS

| | | | |
|---|---|---|---|
| 3,325,731 | 6/1967 | Headle | 324/77 E |
| 3,418,574 | 12/1968 | Wyckoff | 324/77 D |
| 3,641,445 | 2/1972 | Green | 324/77 E |
| 3,731,188 | 5/1973 | Smith | 324/77 E |
| 4,613,818 | 9/1986 | Battocletti | 324/309 |

Primary Examiner—Michael J. Tokar
Attorney, Agent, or Firm—Lerner, David, Littenberg, Krumholz & Mentlik

[57] ABSTRACT

An apparatus and method for processing a first electrical signal having a frequency interval I containing information, and increasing the signal-to-noise ratio thereof utilizes a mixer for shifting the frequencies of the first signal in the interval I to an interval $I_s$. A plurality of filters, coupled in parallel, to the mixer pass, respectively, only frequencies in subintervals of $I_s$, which are mutually disjoint. A second embodiment utilizes a plurality of mixers which shift, respectively, mutually disjoint subintervals of I such that their left end points are substantially equal. A plurality of filters, coupled, respectively, to the mixers, pass, respectively, only those frequencies in the shifted subintervals. Preferably, the frequency intervals passed by the filters in both embodiments are equal in bandwidth, and have no gaps therebetween.

44 Claims, 3 Drawing Sheets

APPARATUS AND METHOD FOR PROCESSING AN ELECTRICAL SIGNAL AND INCREASING A SIGNAL-TO-NOISE RATIO THEREOF

FIELD OF THE INVENTION

The present invention relates generally to the signal processing domain, and more particularly, to an apparatus and method for processing an electrical signal, and increasing a signal-to-noise ratio thereof, especially in the field of MR imaging.

BACKGROUND OF THE INVENTION

Referring to FIG. 1, a conventional MR imaging apparatus comprises an NMR scanner 10 having a coil in which a signal containing information regarding the object being scanned is produced. An amplifier 11, coupled to the NMR scanner 10, strengthens the information signal. A local oscillator 13 provides a signal having a predetermined frequency to a mixer 12 which is coupled to the amplifier 11. The mixer 12 shifts the frequency of the information signal, preferably downwardly, by the frequency of the signal provided by the local oscillator 13. A filter 14, coupled to the mixer 12, passes the interval of frequencies of the information signal which contain the relevant data. An analog-to-digital converter 15, coupled to the filter 14, converts the filtered signal into digital form. A computer 16, coupled to the analog-to-digital converter 15, generates an image of the object being scanned from the digital signals provided by the analog-to-digital converter 15.

The signals in the apparatus contain noise, which ultimately detracts from the clarity of the image created by the computer 16. Specifically, noise in the signals engenders a grainy quality in any resulting image. Present MR imaging apparatus exhibit the limitations in the quality of images owing to noise in the signals.

Accordingly, reduction in noise in such apparatus is highly desirable to enhance the clarity of images.

SUMMARY OF THE INVENTION

The present invention entails an apparatus and method for processing a first electrical signal having a frequency interval I containing information, and increasing the signal-to-noise ratio thereof. The apparatus comprises means for providing the first signal; and means coupled to the first signal providing means, for producing, in parallel, a plurality of signals $S_i$, $i=1, \ldots n$, n being at least 2, $S_i$ being a signal substantially equal to a signal generated by filtering the first signal to eliminate substantially all frequencies thereof beyond a frequency interval $I_i$, and shifting a resulting filtered signal by a constant frequency $f_i$ which may be zero, where the intervals $I_i$ $i=1, \ldots n$ are substantially contained in I, and are substantially mutually disjoint.

In a first preferred embodiment of the apparatus of the present invention, the producing means comprises means, coupled to the first signal providing means, for frequency shifting the first signal so that frequencies thereof in the interval I are shifted to an interval $I_s$; and, a plurality of bandpass filters $F_i$ $i=1, \ldots n$, coupled in parallel to an output terminal of the shifting means, having, respectively, bandpass intervals $I_{si}$ which are substantially contained in $I_s$, and which are substantially mutually disjoint.

In the first preferred embodiment, the signal providing means comprises an NMR scanner coil. This embodiment further comprises a plurality of analog-to-digital converters, coupled, respectively, to the bandpass filters for generating, respectively, digital signals. The sampling time for an analog-to-digital converter is, preferably, $\frac{1}{2}L$, where L is the bandwidth of the bandpass filter to which it is coupled. An amplifier is coupled between the NMR scanner coil and the shifting means for strengthening the signal. A computer, coupled to each of the analog-to-digital converters, generates images from, respectively, the digital signals, and combines the images into one image.

In a second preferred embodiment of the apparatus of the present invention, the producing means comprises a plurality of means $M_i$ $i=1, \ldots n$, coupled, in parallel, to the first signal providing means, for shifting frequencies of the first signal in, respectively, the intervals $I_i$ to, respectively, intervals $I_{is}$ having, respectively, left end points which are substantially equal; and, a plurality of bandpass filters $F_i$ $i=1, \ldots n$, coupled to, respectively, the plurality of shifting means, having, respectively, bandpass intervals $I_{is}$.

In the second preferred embodiment of the apparatus of the present invention, the signal providing means comprises an NMR scanner coil. This preferred embodiment further comprises a plurality of analog-to-digital converters coupled, respectively, to the bandpass filters, for generating, respectively, digital signals. The sampling time for an analog-to-digital converter is, preferably, $\frac{1}{2}L$, where L is the bandwidth of the bandpass filter to which it is coupled. A computer, coupled to each of the analog-to-digital converters, generates images from, respectively, the digital signals, and combines the images into one image. An amplifier is coupled between the NMR scanner coil and the plurality of frequency shifting means.

A method, in accordance with the present invention, of processing a first electrical signal, having a frequency interval I containing information, and increasing a signal-to-noise ratio thereof, comprises producing in parallel, from the first electrical signal, a plurality of signals $S_i$ $i=1, \ldots n$, n being at least 2, $S_i$ being a signal substantially equal to a signal generated by filtering the first signal to eliminate substantially all frequencies thereof beyond a frequency interval $I_i$, and shifting a resulting filtered signal by a constant frequency $f_i$ which may be zero, where the intervals $I_i$ $i=1, \ldots n$ are substantially contained in I, and substantially mutually disjoint.

In a preferred embodiment of the method of the present invention, the step of producing comprises frequency shifting the first signal so that frequencies thereof in the interval I are shifted to an interval $I_s$; then, filtering the shifted signal, in parallel, through a plurality of bandpass filters $F_i$ $i=1, \ldots n$, having, respectively, bandpass intervals $I_{si}$ which are substantially contained in $I_s$, and which are substantially mutually disjoint, to provide, respectively, a plurality of filtered signals.

This preferred method further comprises generating, before the step of frequency shifting, the first signal in an NMR scanner coil; and, converting, after the step of filtering, the plurality of filtered signals, respectively, to a plurality of digital signals. The step of converting preferably comprises utilizing, for each of the filtered signals, a sampling time substantially equal to $\frac{1}{2}L$, where L is the bandwidth of the corresponding filter. The method additionally comprises, between the steps of generating the first signal and frequency shifting the first signal, amplifying the first signal; and, generating, after the step of converting, a plurality of images from, respectively, the plurality of digital signals, and combining the images into one image.

In another preferred embodiment of the method of the present invention, the step of producing comprises frequency shifting the first signal to produce, in parallel, a plurality of shifted signals wherein frequencies of the first signal in, respectively, the intervals $I_i$ are shifted to, respectively, intervals $I_{is}$ having, respectively, left end points which are substantially equal; and, filtering, in parallel, the shifted signals through, respectively, a plurality of bandpass filters having, respectively, bandpass intervals $I_{is}$, to produce, respectively, a plurality of filtered signals.

A preferred version of this method of the present invention further comprises generating, before the step of frequency shifting, the first signal in an NMR scanner coil; and converting, after the step of filtering, the plurality of filtered signals, respectively, to a plurality of digital signals. This embodiment additionally comprises, between the steps of generating the first signal and frequency shifting the first signal, amplifying the first signal; and, generating, after the step of converting, a plurality of images from, respectively, the plurality of digital signals, and combining the images into one image.

In the embodiments of the present invention, the length of the interval $I_i$ is preferably substantially constant for all i. Further, the union of the intervals $I_i$ i=1, .. n is preferably substantially I.

The present invention increases the signal-to-noise ratio of the first electrical signal by generating therefrom a plurality of signals having smaller frequency bandwidths. In general, the signal-to-noise ratio of a particular signal is inversely proportional to the square root of the bandwidth. The present invention exploits this relationship by subdividing the information frequency interval of the first signal into smaller non-overlapping overlapping intervals, and decomposing the first signal into signals corresponding to these intervals. In this fashion, since the bandwidths of the resulting signals are smaller than that of the first signal, their signal-to-noise ratios are accordingly higher.

Such signals, derived from the first signal, having higher signal-to-noise ratios than the first signal, may be employed in MR imaging to produce clearer images. This is accomplished by utilizing the individual signals, each having a smaller bandwidth than the first signal, to generate, respectively, images which are combined into one image. The resulting single image is clearer than that obtained by processing the first signal according to the prior art; since, the signal-to-noise ratios of the individual signals are higher than that of the first signal from which they were derived. Thus, the present invention finds application in the MR imaging field, for enhancing the clarity of images; but also in any domain wherein an increase in signal-to-noise ratio is advantageous.

DETAILED DESCRIPTION OF THE PREFERRED EMBODIMENT

The present invention entails an apparatus and method for processing a first electrical signal having a frequency interval I containing information, and for increasing a signal-to-noise ratio thereof.

Figure 1:
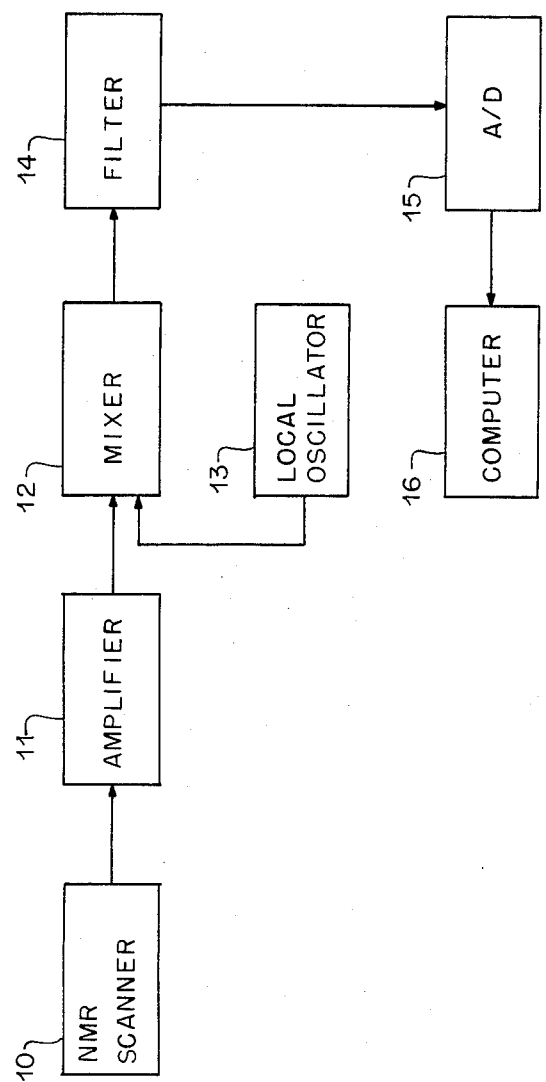
FIG. 1 is a schematic diagram of an MR imaging apparatus of the prior art.
Figure 2:
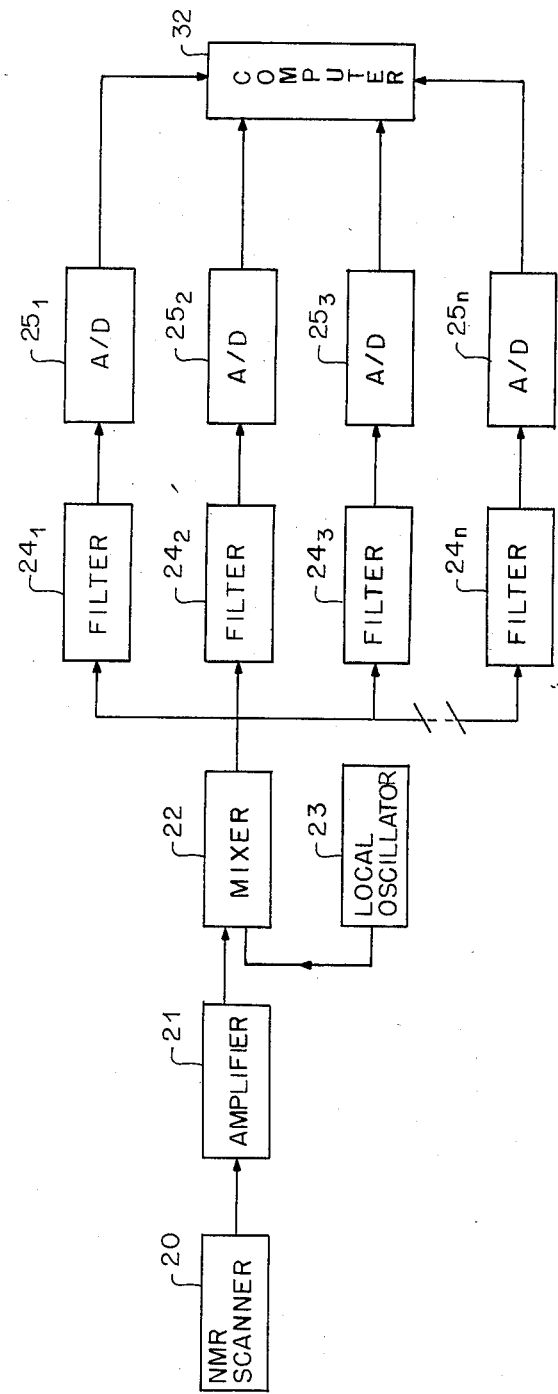
FIG. 2 is a schematic diagram of an MR imaging apparatus in accordance with a first preferred embodiment of the present invention.

Referring to FIG. 2, a preferred embodiment of the apparatus of the present invention is depicted, entailing an MR imaging apparatus. An object (not shown) is inserted into an NMR scanner 20 which generates a first signal representing the portion of the object being scanned. The information in the first signal is contained in a frequency interval I. The amplifier 21, coupled to the NMR scanner 20, strengthens the amplitude of the first signal. A local oscillator 23, coupled to a mixer 22, generates a signal having a predetermined frequency. The mixer 22, coupled to the amplifier 21, shifts the frequency of the amplified first signal preferably downwardly by the predetermined frequency. The frequency interval I containing information is shifted to an interval $I_s$ having, preferably, a left end point which is substantially 0. A plurality of filters $24_1$–$24_n$ are coupled in parallel to the mixer 22. The filter $24_i$ i=1, .. n filters the output of the mixer to eliminate substantially all frequencies thereof beyond an interval $I_{si}$ which is contained in $I_s$. The subintervals $I_{si}$ i=1, .. n are substantially mutually disjoint. That is, the intersection of any two of these subintervals is substantially empty. Preferably, the length of $I_{si}$ is substantially identical for all i. Preferably, the union of $I_{si}$ over all i is substantially $I_s$; however, this union may be a proper subset of $I_s$. In this latter case, some frequencies in the interval $I_s$ are completely filtered away. A plurality of analog-to-digital converters $25_1$–$25_n$, coupled, respectively, to the filters $24_1$–$24_n$, convert the output signals of the filters $24_1$–$24_n$ to, respectively, a plurality of digital signals. The sampling time, that is, the time between samples, denoted $T_i$ i=1, .. n, for the analog-to-digital converter $25_i$ is preferably $\frac{1}{2}L_i$, where $L_i$ is the bandwidth of the corresponding filter $24_i$, that is, the length of $I_{si}$. When the length of $I_{si}$ is the same for all i, and the union of $I_{si}$ over all i is $I_s$, then $L_i$ i=1, .. n equals the length $I_s$ (or I) divided by n. In this case, accordingly, the sampling time for each analog-to-digital converter $25_i$ is n times that of the analog-to-digital converter 15 of the prior art in FIG. 1, for the same information frequency interval I. A computer 32, coupled to the analog-to-digital converters $25_1$–$25_n$, generates a plurality of images from, respectively, the plurality of digital signals, and combines the plurality of images into a single image. The operation of the computer 32 in effecting processing of the digital signals to form respective images, and in combining these images into a single one is well-known in the art, and accordingly, requires no further elaboration.

The output signal of the filter $24_i$ i=1, .. n possesses a frequency interval $I_{si}$ which is contained in the frequency interval $I_s$. Therefore, the bandwidth of $I_{si}$ is less than that of $I_s$. Since the frequency interval $I_s$ is a shifting of the information frequency interval I of the first signal, the bandwidth of I is equal to that of $I_s$. Accordingly, the bandwidth of $I_{si}$ i=1, .. n is less than that of I. Since the signal-to-noise ratio of a signal is generally inversely proportional to the square root of the bandwidth of that signal, and since the bandwidth of the output signal of the filter $24_i$ is less than that of the first signal generated by the NMR scanner, the signal-tonoise ratio of the output signal of the filter $24_i$ is higher than that of the first signal. In this fashion, the first signal is decomposed into a plurality of signals, each of which possesses a higher signal-to-noise ratio than the first signal from which it was derived. Accordingly, the individual images generated from, respectively, the output signals of the analog-to-digital converters $25_i$ $i=1,\ldots n$ are clearer than the image which could have been generated from the undecomposed first signal. These individual images may now be combined, in a fashion well-known in the art, into a single image. This single image resulting from combining the plurality of images having enhanced clarity is, accordingly, clearer than the image obtainable from processing the undecomposed first signal in accordance with the prior art.

Figure 3:
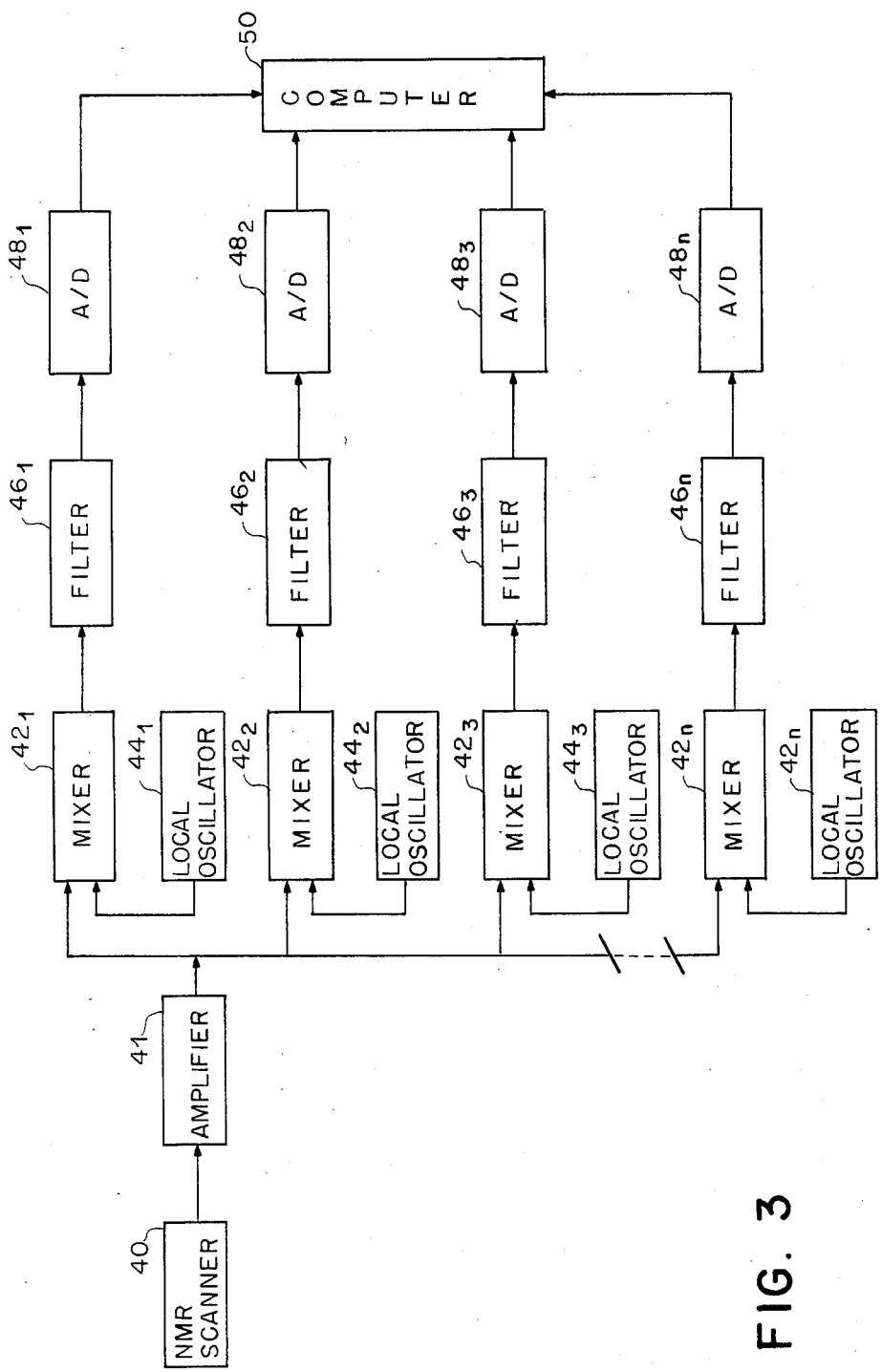
FIG. 3 is a schematic diagram of an MR imaging apparatus in accordance with a second preferred embodiment of the present invention.

Referring to FIG. 3, an MR imaging apparatus in accordance with a second preferred embodiment of the present invention is depicted. An object (not shown) is inserted into an NMR scanner 40 which generates a first signal representing the portion of the object being scanned. The information in the first signal is contained in a frequency interval I. An amplifier 41, coupled to the NMR scanner 40, strengthens the amplitude of the first signal. A plurality of local oscillators $44_1$–$44_n$ are coupled, respectively, to a plurality of mixers $42_1$–$42_n$. The local oscillator $44_i$ $i=1,\ldots n$ provides a reference signal having a frequency $f_i$ to the mixer $42_i$ which shifts an input signal thereto preferably downwardly by the frequency $f_i$. The mixers $42_1$–$42_n$ are coupled in parallel to the amplifier 41.

Frequency intervals $I_i$ $i=1,\ldots n$ are substantially contained in the information frequency interval I, and are substantially mutually disjoint. That is, the intersection of any two of the intervals $I_i$ is substantially empty. Preferably, but not necessarily, the union of the intervals $I_i$ over all i is substantially equal to I. Preferably also, the length of each $I_i$ is substantially the same. The frequencies $f_i$ $i=1,\ldots n$ of the reference signals of the local oscillators $44_i$ are preferably selected so that the mixers $42_i$ shift, respectively, the frequencies of the first signal in the intervals $I_i$ to, respectively, intervals $I_{is}$ having left end points which are substantially the same. That is, the mixer $42_i$ shifts the interval $I_i$ to an interval $I_{is}$ having a particular left end point. Preferably, the frequencies $f_i$ $i=1,\ldots n$ of the reference signals are selected so that the left end points of, respectively, the intervals $I_{is}$ are substantially the same. A plurality of filters $46_1$–$46_n$ are coupled, respectively, to the plurality of mixers $42_1$–$42_n$. The filter $46_i$ $i=1,\ldots n$ filters the output signal of the mixer $42_i$ to eliminate substantially all frequencies thereof beyond the interval $I_{is}$. A plurality of analog-to-digital converters $48_1$–$48_n$ are coupled, respectively, to the filters $46_1$–$46_n$, and convert the plurality of output signals of the filters $46_1$–$46_n$ to, first preferred embodiment, the sampling time, $T_i$ $i=1,\ldots n$, for the analog-to-digital converter $48_i$ is preferably $\frac{1}{2}L_i$, where $L_i$ is the bandwidth of the corresponding filter $46_i$. When the bandwidth of each filter $46_i$ is the length of I divided by n, then the sampling time of each analog-to-digital converter $48_i$ is n times that of the analog-to-digital converter 15 utilized in the prior art depicted in FIG. 1, for the same information frequency interval I. A computer 50, coupled to the analog-to-digital converters $48_1$–$48_n$ generates from, respectively, the plurality of digital signals a plurality of images, and combines the images into one image.

The signal-to-noise ratio of a signal is generally inversely proportional to the square root of the bandwidth of the signal. Since the intervals $I_i$ $i=1,\ldots n$ are contained in the interval I, the bandwidth of each interval $I_i$ is smaller than that of I. Since the interval $I_{is}$ $i=1,\ldots n$ is formed by shifting the interval $I_i$, the bandwidth of $I_{is}$ is equal to that of $I_i$. Thus, the bandwidth of $I_{is}$ $i=1,\ldots n$ is less than that of I. Accordingly, the output signal of the filter $46_i$ which possesses a frequency interval of $I_{is}$ has a higher signal-to-noise ratio than the portion of the first signal, generated by the NMR scanner, which lies in the frequency interval I. In this fashion, the first signal has been decomposed into a plurality of signals, each having a higher signal-to-noise ratio than the first signal from which it was derived. Accordingly, clearer images may be generated by the computer 50 from, respectively, the output signals of the analog-to-digital converters $48_1$–$48_n$. Such improved images may then be combined to produce a single image which is superior to that which has been obtained in the prior art from the undecomposed first signal generated by the NMR scanner.

More generally, since the signal-to-noise ratio of a signal is generally inversely proportional to the square root of its bandwidth, the present invention entails any apparatus for generating from a first signal having a frequency interval I containing information, a plurality of signals having frequency intervals which correspond, respectively, to subintervals of I which may be frequency shifted. That is, the apparatus of the present invention entails any means for producing, in parallel, from a first signal having a frequency interval I containing information, a plurality of signals $S_i$, $i=1,\ldots n$, n being at least 2, where $S_i$ is a signal substantially equal to a signal generated by filtering the first signal to eliminate substantially all frequencies thereof beyond an interval $I_i$ contained in the interval I, and shifting the resulting filtered signal by a constant frequency $f_i$ which may be 0. The union of all the intervals $I_i$ is substantially contained in I, and the intervals $I_i$ are mutually substantially disjoint. That is, each interval $I_i$ is substantially contained in the interval I, and is substantially disjoint from the other such intervals. Preferably, the union of all the intervals $I_i$ is substantially I, and the length of each interval is substantially the same. In this fashion, the information in the first signal in the interval I is also, to the extent desired, available in the generated signals $S_i$; but, the signal-to-noise ratio of each of the derivative signals $S_i$ is higher than that of the first signal since their frequency intervals $I_i$ each have a smaller bandwidth than the interval I. This general apparatus of the present invention may be utilized in any signal processing system wherein increasing the signal-to-noise ratio is beneficial.

Further, the present invention entails methods corresponding to the operations of the preferred embodiments and the more general apparatus described above.

While the invention has been described in its preferred embodiments, it is to be understood that the words which have been used are words of description rather than limitation, and that changes within the purview of the appended claims may be made without departing from the true scope and spirit of the invention in its broader aspects.

We claim:

1. An apparatus for processing a first electrical signal, having a frequency interval I which extends from a first frequency to a second frequency containing information, and for increasing the signal-to-noise ratio thereof, comprising:

means for providing said first signal; and means, for producing, in parallel, a plurality of signals $S_i$, $i=1,\ldots n$, n being at least 2, $S_i$ being a signal substantially equal to a signal generated by filtering said first signal to eliminate substantially all frequencies thereof beyond an interval $I_i$ which extends from a first interval frequency $I_{first\text{-}i}$ to a second interval frequency $I_{second\text{-}i}$, and shifting the frequencies within the filtered signal by a constant frequency $f_i$ which may be zero, where the intervals $I_i$ $i=1,\ldots n$ are substantially contained in I, and are substantially mutually disjoint.

2. The apparatus of claim 1, wherein said producing means comprises:

means, coupled to said first signal providing means, for frequency shifting said first signal so that frequencies thereof in said interval I are shifted to an interval $I_s$ which extends from a new first frequency to a new second frequency; and a plurality of bandpass filters $F_i$ $i=1,\ldots n$, coupled in parallel to an output terminal of said shifting means, having, respectively, bandpass intervals $I_{si}$ which extend from a first bandpass interval frequency to a second bandpass interval frequency which are substantially contained in said $I_s$, and which are substantially mutually disjoint.

3. The apparatus of claim 2, wherein said first signal providing means comprises an NMR scanner coil; and further comprising a plurality of analog-to-digital converters coupled, respectively, to said bandpass filters, for generating, respectively, digital signals.

4. The apparatus of claim 3, wherein each of said plurality of analog-to-digital converters is adapted for a sampling time substantially equal to 1/2L, where L is a bandwidth of a corresponding one of said bandpass filters.

5. The apparatus of claim 3 further comprising:

a computer, coupled to each of said analog-to-digital converters, for generating images from, respectively, said digital signals, and combining said images into one image.

6. The apparatus of claim 5, further comprising means, coupled between said NMR scanner coil and said shifting means, for amplifying said first signal.

7. The apparatus of claim 2, wherein the frequency difference between the second bandpass interval frequency and the first bandpass interval frequency of $I_{si}$ is substantially constant for all i.

8. The apparatus of claim 2, wherein a union of the intervals $I_{si}$ is substantially $I_s$.

9. The apparatus of claim 1, wherein said producing means comprises:

a plurality of means $M_i$ $i=1,\ldots n$, coupled in parallel to said first signal providing means, for shifting frequencies of said first signal in, respectively, said intervals $I_i$ to, respectively, intervals $I_{is}$, each of which intervals extends from a left end point frequency to a right end point frequency, said intervals having, respectively, left end point frequencies which are substantially equal; and a plurality of bandpass filters $F_i$ $i=1,\ldots n$, coupled to, respectively, said plurality of shifting means, having, respectively, bandpass intervals $I_{is}$.

10. The apparatus of claim 9, wherein said first signal providing means comprises an NMR scanner coil; and further comprising a plurality of analog-to-digital converters coupled, respectively, to said bandpass filters, for generating, respectively, digital signals.

11. The apparatus of claim 10, wherein each of said plurality of analog-to-digital converters is adapted for a sampling time substantially equal to $\frac{1}{2}L$, where L is a bandwidth of a corresponding one of said bandpass filters.

12. The apparatus of claim 10 further comprising a computer, coupled to each of said analog-to-digital converters, for generating images from, respectively, said digital signals, and combining said images into one image.

13. The apparatus of claim 12 further comprising means, coupled between said NMR scanner coil and said plurality of shifting means, for amplifying said first signal.

14. The apparatus of claim 9, wherein the frequency difference between the second interval frequency $I_{second\text{-}i}$ and the first interval frequency $I_{first\text{-}i}$ of $I_i$ is substantially constant for all i.

15. The apparatus of claim 9, wherein a union of the intervals $I_i$ is substantially I.

16. The apparatus of claim 1, wherein the frequency difference between the second interval frequency $I_{second\text{-}i}$ and the first interval frequency $I_{first\text{-}i\, of\, I_i}$ is substantially constant for all i.

17. The apparatus of claim 1, wherein a union of the intervals $I_i$ is substantially I.

18. The apparatus of claim 16, wherein $I=[a, b]$ and $f_i$ is substantially $-a$ for all i.

19. The apparatus of claim 16, wherein $f_i$ $i=1,\ldots n$, is such that the frequency difference between the second interval frequency $I_{second\text{-}i}$ and the first interval frequency $I_{first\text{-}i}$ of $S_i$ is substantially identical for all i.

20. The apparatus of claim 1, wherein said first signal providing means comprises an NMR scanner coil; and further comprising a plurality of analog-to-digital converters, coupled to said producing means, for converting, respectively, said plurality of signals $S_i$ to digital signals.

21. The apparatus of claim 20 further comprising a computer, coupled to each of said analog-to-digital converters, for generating images from, respectively, said digital signals, and combining said images into one image.

22. The apparatus of claim 21 further comprising means, coupled between said NMR scanner coil and said producing means, for amplifying said first signal.

23. A method of processing a first electrical signal having a frequency interval I which extends from a first frequency to a second frequency containing information, and of increasing the signal-to-noise ratio thereof, comprising:

producing in parallel, from said first electrical signal, a plurality of signals $S_i$ $i=1,\ldots n$, n being at least 2, $S_i$ being a signal substantially equal to a signal generated by filtering said first signal to eliminate substantially all frequencies thereof beyond a frequency interval $I_i$ which extends from a first interval frequency $I_{first\text{-}i}$ to a second interval frequency $I_{second\text{-}i}$, and shifting the frequencies within the filtered signal by a constant frequency $f_i$ which may be zero, where said intervals $I_i$ $i=1,\ldots n$ are substantially contained in I, and substantially mutually disjoint.

24. The method of claim 23, wherein said step of producing comprises:

frequency shifting said first signal so that frequencies thereof in said interval I are shifted to an interval $I_s$ which extends from a new first frequency to a new second frequency; then filtering said shifted signal, in parallel through a plurality of bandpass filters $F_i$ i=1, . . n, having, respectively, bandpass intervals $I_{si}$ which extend from a first bandpass interval frequency to a second interval frequency, which are substantially contained in $I_{si}$, and which are substantially mutually disjoint, to provide, respectively, a plurality of filtered signals.

25. A method of claim 24 further comprising:
generating before the step of frequency shifting, said first signal in an NMR scanner coil; and
converting, after the step of filtering, said plurality of filtered signals, respectively, to a plurality of digital signals.

26. The method of claim 25, wherein the step of converting comprises utilizing, for each of said filtered signals, a sampling time substantially equal to $\frac{1}{2}L$, where L is a bandwidth of a corresponding one of said filters.

27. The method of claim 25 further comprising: generating, after the step of converting, a plurality of images from, respectively, said plurality of digital signals, and combining said images into one image.

28. The method of claim 27 further comprising: amplifying, between the steps of generating said first signal and frequency shifting said first signal, said first signal.

29. The method of claim 24 wherein the frequency difference between the second interval frequency $I_{second-i}$ and the first interval frequency $I_{first-i}$ of $I_{si}$ is substantially constant for all i.

30. The method of claim 24, wherein a union of the intervals $I_{si}$ is substantially $I_s$.

31. The method of claim 23 wherein said step of producing comprises:
frequency shifting said first signal to produce, in parallel, a plurality of shifted signals wherein frequencies of said first signal in, respectively, said intervals $I_i$ are shifted to, respectively, intervals $I_{is}$, each of which intervals extends from a left end point frequency to a right end point frequency, said intervals having, respectively, left end point frequencies which are substantially equal; and
filtering, in parallel, said shifted signals through, respectively, a plurality of bandpass filters having, respectively, bandpass intervals $I_{is}$, to produce, respectively, a plurality of filtered signals.

32. The method of claim 31 further comprising:
generating, before the step of frequency shifting, said first signal in an NMR scanner coil; and
converting, after the step of filtering, said plurality of filtered signals, respectively, to a plurality of digital signals.

33. The method of claim 32, wherein the step of converting comprises utilizing, for each of said filtered signals, a sampling time substantially equal to $\frac{1}{2}L$, where L is a bandwidth of a corresponding one of said filters.

34. The method of claim 32 further comprising:
generating, after the step of converting, a plurality of images from, respectively, said plurality of digital signals, and combining said images into one image.

35. The method of claim 34 further comprising:
amplifying, between the steps of generating said first signal and frequency shifting said first signal, said first signal.

36. The method of claim 31, wherein the frequency difference between the second interval frequency $I_{second-i}$ and the first interval frequency $I_{first-i}$ of $I_i$ is substantially constant for all i.

37. The method of claim 31, wherein a union of the intervals $I_i$ is substantially I.

38. The method of claim 23 further comprising:
generating, before the step of producing, said first signal in an NMR scanner coil; and
converting, after the step of producing, said plurality of signals $S_i$, respectively, to a plurality of digital signals.

39. The method of claim 38 further comprising:
generating, after the step of converting, a plurality of images from, respectively, said plurality of digital signals, and combining said images into one image.

40. The method of claim 39 further comprising:
amplifying, between the steps of generating said first signal and producing said plurality of signals $S_i$, said first signal.

41. The method of claim 23, wherein the frequency difference between the second interval frequency $I_{second-i}$ and the first interval frequency $I_{first-i}$ of $I_i$ is substantially constant for all i.

42. The method of claim 23, wherein a union of the intervals $I_i$ is substantially I.

43. The method of claim 41, wherein I=[a, b] and $f_i$ is substantially $-a$ for all i.

44. The method of claim 41, wherein $f_i$ i=1, . . n is such that a frequency interval of $S_i$ is substantially identical for all i.

* * * * *

UNITED STATES PATENT AND TRADEMARK OFFICE
CERTIFICATE OF CORRECTION

PATENT NO. : 4,737,713

DATED : April 12, 1988

INVENTOR(S) : Danby et al.

It is certified that error appears in the above-identified patent and that said Letters Patent is hereby corrected as shown below:

Column 3, line 39, delete "overlapping".

Column 5, line 54, after "to,", insert --respectively, a plurality of digital signals. As for the--.

Column 8, line 24, line 23, "$I_{first-i}$ of $I_i$" should read --$I_{first-i}$ of $I_i$--.

Signed and Sealed this

Twentieth Day of September, 1988

Attest:

DONALD J. QUIGG

*Attesting Officer*  *Commissioner of Patents and Trademarks*